United States Patent
Rowe

(10) Patent No.: US 8,568,607 B2
(45) Date of Patent: Oct. 29, 2013

(54) HIGH-PH SYNTHESIS OF NANOCOMPOSITE THERMOELECTRIC MATERIAL

(75) Inventor: Michael Paul Rowe, Pinckney, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 296 days.

(21) Appl. No.: 13/023,015

(22) Filed: Feb. 8, 2011

(65) Prior Publication Data
US 2012/0199797 A1 Aug. 9, 2012

(51) Int. Cl.
*H01L 35/16* (2006.01)
(52) U.S. Cl.
USPC ........ 252/62.3 T; 428/403; 977/775; 977/833
(58) Field of Classification Search
USPC ............... 252/62.3 T; 428/403; 977/775, 833
See application file for complete search history.

(56) References Cited

U.S. PATENT DOCUMENTS

| | | | |
|---|---|---|---|
| 7,068,898 | B2 | 6/2006 | Buretea et al. |
| 7,259,320 | B2 | 8/2007 | Take |
| 7,465,871 | B2 | 12/2008 | Chen et al. |
| 7,586,033 | B2 | 9/2009 | Ren et al. |
| 2009/0151766 | A1* | 6/2009 | Murai et al. ................. 136/201 |
| 2009/0185942 | A1 | 7/2009 | Choi, Sr. et al. |
| 2009/0314324 | A1* | 12/2009 | Murai et al. ................. 136/201 |
| 2010/0212328 | A1* | 8/2010 | Murai et al. ................... 62/3.2 |

FOREIGN PATENT DOCUMENTS

| | | | |
|---|---|---|---|
| JP | 2010-010366 | * | 1/2010 |
| JP | 2010-093024 | * | 4/2010 |
| WO | WO 2007/066820 | * | 6/2007 |
| WO | WO 2008/149871 | * | 12/2008 |

OTHER PUBLICATIONS

Translation for JP 2010-010366, Jan. 2010.*
Translation for JP 2010-093024, Apr. 2010.*

* cited by examiner

*Primary Examiner* — Carol M Koslow
(74) *Attorney, Agent, or Firm* — Gifford, Krass, Sprinkle, Anderson & Citkowski, P.C.

(57) ABSTRACT

A process for forming thermoelectric nanoparticles includes the steps of providing a reducing agent, and at least one first metal; mixing the reducing agent and at least one first metal forming a premixed reducing solution; providing a second metal containing compound, and a core material; mixing the second metal containing compound and the core material forming a premixed second metal reaction solution separate from the premixed reducing solution; and mixing and reacting the premixed second metal reaction solution with the premixed reducing solution. A spontaneous alloying occurs about the core material forming thermoelectric composite nanoparticles.

22 Claims, 5 Drawing Sheets

Composite nanoparticles of $(BiSb)_2Te_3 + SiO_2$ (Ludox) show good distribution of the constituent elements

HIGH-PH SYNTHESIS OF NANOCOMPOSITE THERMOELECTRIC MATERIAL

FIELD OF THE INVENTION

The invention relates to thermoelectric nanoparticles and in particular to a process for producing thermoelectric composite nanoparticles and thermoelectric nano composite materials.

BACKGROUND OF THE INVENTION

Thermoelectric materials and devices may be utilized to obtain electrical energy from a thermal gradient. Current thermoelectric materials have a limited thermoelectric conversion efficiency which may be defined in terms of the formula $ZT=TS^2\gamma/\kappa$. The ZT of the above formula or figure of merit is related on the macroscopic transport parameters of the material including the Seebeck coefficient S, the electrical conductivity $\gamma$ and the thermal conductivity $\kappa$.

In order to improve the thermoelectric conversion efficiency one may increase the Seebeck coefficient and electrical conductivity while lowering the thermal conductivity. Increasing the ZT is difficult as the three parameters S, $\gamma$ and $\kappa$ are interrelated. For example, doping of a specific material may increase the electrical conductivity while decreasing the Seebeck coefficient and increasing the thermal conductivity. There is therefore a need in the art for a material having a ZT improved over current prior art materials. There is also a need in the art for increasing the thermoelectric conversion by increasing or maintaining the Seebeck coefficient and electrical conductivity while lowering a thermal conductivity.

Nanostructured materials may be utilized to produce thermoelectric nanoparticles and materials that may be utilized to form a thermoelectric composite material. However, such nanostructured materials may be difficult and expensive to manufacture and may be difficult to process to form a composite material. There is therefore a need in the art for a thermoelectric nanostructured material and a process for producing the same that produces materials having an increased thermoelectric conversion efficiency. Additionally, there is a need in the art for a process for producing the thermoelectric nanoparticles that is cost efficient and scalable. Further, there is a need in the art for a process for producing thermoelectric composites having improved properties that overcomes technical problems of manufacturing in the prior art.

SUMMARY OF THE INVENTION

In one aspect, there is disclosed a process for forming thermoelectric nanoparticles that includes the steps of: providing a reducing agent, and at least one first metal, mixing the reducing agent and at least one first metal forming a premixed reducing solution, providing a second metal containing compound, and a core material, mixing the second metal containing compound, and the core material forming a premixed second metal reaction solution, reacting the premixed second metal reaction solution with the premixed reducing solution forming thermoelectric composite nanoparticles.

In a further aspect, there is disclosed a process for forming thermoelectric materials that includes the steps of providing a reducing agent, and a tellurium containing compound, mixing the reducing agent and tellurium containing compound forming a premixed reducing solution, providing a bismuth containing compound, and a core material, mixing the bismuth containing compound, and the core material forming a premixed bismuth reaction solution, reacting the premixed bismuth reaction solution with the premixed reducing solution wherein bismuth ions of the bismuth containing compound are reduced to bismuth metal in the presence of tellurium wherein a spontaneous alloying occurs about the core material forming thermoelectric composite nanoparticles.

DETAILED DESCRIPTION OF THE PREFERRED EMBODIMENTS

Figure 1:
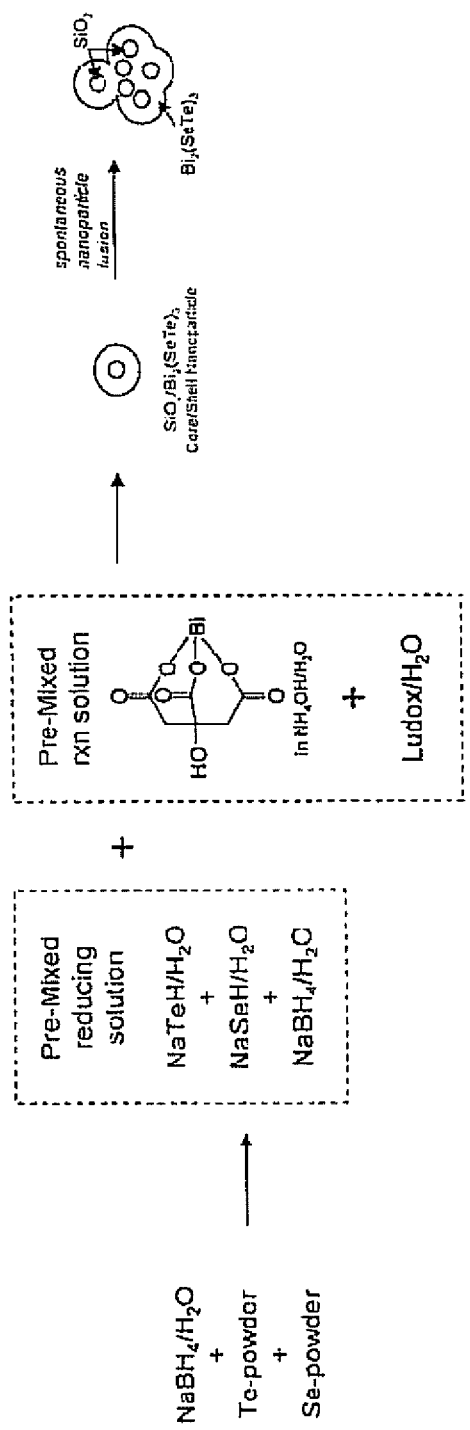
FIG. 1 is a graphical depiction of the steps of one embodiment of the invention.

Referring to FIG. 1, there is shown a first embodiment of a process for forming thermoelectric nanoparticles that includes the steps of there is disclosed a process for forming thermoelectric nanoparticles that includes the steps of: providing a reducing agent, and at least one first metal, mixing the reducing agent and at least one first metal forming a premixed reducing solution, providing a second metal containing compound, and a core material, mixing the second metal containing compound, and the core material forming a premixed second metal reaction solution, reacting the premixed second metal reaction solution with the premixed reducing solution forming thermoelectric composite nanoparticles. In one aspect the second metal is reduced by the premixed reducing solution and alloys about the core material. The second metal may be selected from: bismuth compounds; for example, bismuth citrate and ammonium bismuth citrate. The first metal may be selected from tellurium compounds; for example tellurium powder, tellurium salts and sodium tellurium hydride. In one aspect, the premixed second metal reaction solution or bismuth containing solution may have a pH greater than 7.

In one aspect, the bismuth containing compound may be selected from bismuth citrate, ammonium bismuth citrate and other bismuth salts. As stated above, the bismuth containing compound is preferably soluble in a pH of the basic range.

In one aspect, the tellurium containing compound may be selected from tellurium powder, tellurium salts and sodium tellurium hydride.

The bismuth containing compound such as bismuth citrate will react with the tellurium containing compound such as sodium tellurium hydride to spontaneously alloy about a core material particle. In one aspect, the core material may be selected from various materials including: $SiO_2$, metals, semiconductors, insulators, ceramics, carbon, polymers, salts or combinations thereof and ceramic materials including alumina, titanium dioxide, and zirconium oxide. The shell material may be selected from $Bi_2Te_3$, chalcogenide semiconductors including bismuth telluride and lead telluride, metals, semi-metals including binary, ternary and quaternary alloys of conductors, semiconductors, and insulators, compounds of silicon and germanium, skutterudite materials including $CoSb_3$ materials, rare earth intermetallics including $YbAl_3$, clathrate structured materials including silicon germanium or SN framework based materials, $Mg_2Si$ and doped forms of Mg$_2$Si, half heusler alloys including MNiSn materials where M may represent Zr, Hf and Ti, multicomponent metal oxides including NaCo$_2$O$_4$, Ca$_3$Co$_4$O$_9$, and thermoelectric materials and doping materials including groups III, IV, V, VI, and VII elements, oxides of such elements, alloys, and salts.

The process may also include the steps of providing various dopants that are desirable in a thermoelectric material. The process may include the steps of providing P-type and N-type dopants to the final thermoelectric compound. The process can include the step of mixing a P-type dopant with the second metal containing compound. In one aspect, the process may include the step of providing a P-type dopant with the bismuth containing compound. Various P-type dopants may be included such as antimony, antimony salt, and potassium antimony tartrate. Additionally, the process may include the step of providing an N-type dopant with the tellurium containing compound. In one aspect, the N-type dopants may be selected from various compounds including selenium and sodium selenium hydride.

Figure 2:
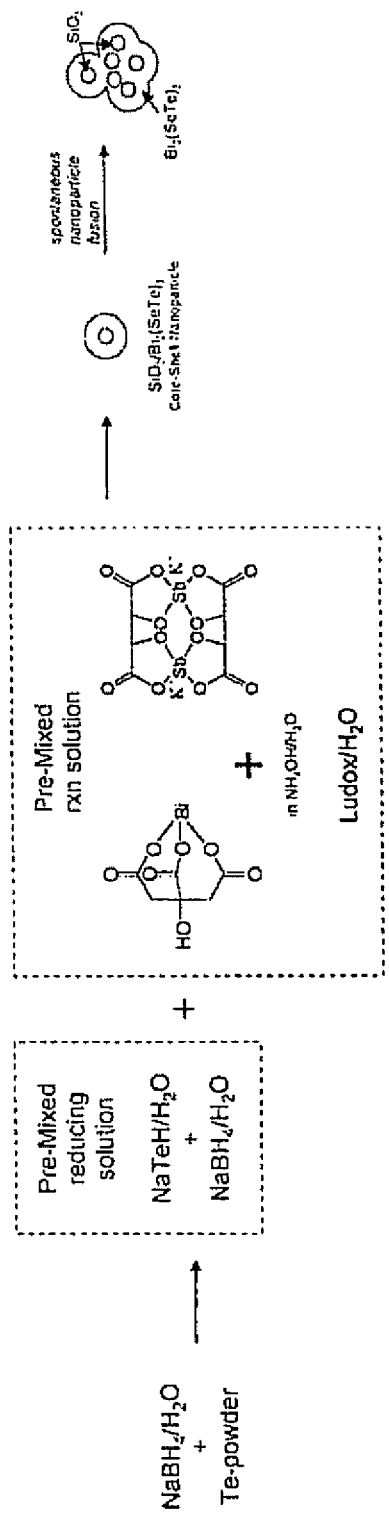
FIG. 2 is a graphical depiction of the steps of another embodiment.

In one aspect, the process as disclosed in FIGS. 1 and 2 may include the use of a premixed reducing solution and a premixed second metal reaction solution or a bismuth reaction solution. In one aspect, the core material may be a commercially available ceramic nanoparticle such as Ludox that is dispersed in a liquid, The reaction of the premixed reducing solution and the premixed second metal reaction solution causes the bismuth containing compound and tellurium containing compound in the presence of a reducing agent to alloy with the bismuth containing compound forming composite thermoelectric nanoparticles having a core and shell structure. As described above, P-type and N-type dopants may be included with the bismuth containing compound and the tellurium containing compound respectively.

As stated above, bismuth citrate may be utilized as the bismuth containing compound. Additionally, the tellurium compound may include sodium tellurium hydride. When the bismuth citrate is combined with the tellurium, bismuth ions of the bismuth citrate are reduced to bismuth metal in the presence of tellurium wherein a spontaneous alloying occurs about the core nanoparticles. In one aspect, the core nanoparticles may have a size of from 1 to 50 nanometers in diameter. Additionally, the composite thermoelectric nanoparticles may have a size of from 1.5 nanometers to 1.0 microns in diameter. In another aspect, the composite thermoelectric nanoparticles may have a shell thickness of from 0.5 to 100 nanometers.

Following the formation of the thermoelectric nanoparticle composites, various isolation and purification steps may be performed. For example, the process may include the steps of decanting the composite thermoelectric nanoparticles following their formation as well as the step of washing the composite thermoelectric nanoparticles. In one aspect, the washing step may include washing the composite thermoelectric nanoparticles with an water, methanol and ammonium hydroxide.

Following the formation of the thermoelectric nanoparticles, the material may be formed into a nanocomposite material for use in thermoelectric devices. In one aspect, the nanoparticles may spontaneously fuse forming a nanocomposite material following the formation of the thermoelectric nanoparticles such that the nanocomposite material includes a network. In another aspect, the forming step may include sintering the composite thermoelectric materials forming a network of the shell material including inclusions of the core material nanoparticles.

EXAMPLES

The following examples are detailed for various aspects of the process wherein bismuth telluride shell materials are formed about a silicon dioxide core to form composite nanoparticles.

Examples

Either nitrogen or argon gas is used throughout the synthesis to evacuate the reaction of oxygen.

Synthesis of N-type Bi$_2$(SeTe)$_3$+SiO$_2$:

To a 250 mL Schlenk flask is added 5.411 g Te-powder, 0.3053 g Se-powder, Teflon stir bar, and 103 ml water. The reaction is degassed with inert gas and cooled in an ice/water bath. 6.281 g of NaBH$_4$ is added in portions to the stirring reaction. The reaction is allowed to warm up to room temperature and proceed until the metal powder is gone (8 to 12 hours).

To a 1 L 5-neck round bottom flask is added an overhead Teflon stirrer, 260 ml water, 150 ml NH$_4$OH (28%), and 12.291 g bismuth citrate. The reaction is stirred until dissolved and degassed with inert gas. 4.124 g of SM-30 Ludox silica nanoparticles are added and mixed into the reaction thoroughly. The NaTeH+NaSeH solution is filtered (always under an oxygen-free atmosphere) through a fritted glass filter. The reaction flask is stirred at 390 rpms, and the filtered hydride solution is added drop wise over 30 minutes. After 45 minutes, 100 ml of methanol is added. The reaction solution is decanted off and the product is collected with methanol and centrifugation.

The product is kept under an inert atmosphere and washed with 17.5/82.5/0.4 water/methanol/NH$_4$OH (28%), by volume respectively. The product is then dried of solvent.

Synthesis of P-Type (BiSb)$_2$Te$_3$+SiO$_2$:

To a 250 ml Schlenk flask is added 5.903 g Te-powder, Teflon stir bar, and 103 ml water. The reaction is degassed with inert gas and cooled in an ice/water bath. 6.286 g of NaBH$_4$ is added in portions to the stirring reaction. The reaction is allowed to warm up to room temperature and proceed until the metal powder is gone (8 to 12 hours).

To a 1 L 5-neck round bottom flask is added an overhead Teflon stirrer and 480 ml water. The reaction is stirred and degassed with inert gas. A solution of 6.5 ml water and 5.5 ml NH$_4$OH (28%) is made, and 9.016 g potassium antimony tartrate and 1.535 g bismuth citrate are dissolved in this water/NH$_4$OH solution. 4.131 g of SM-30 Ludox silica nanoparticles are added and mixed into the reaction flask thoroughly. The reaction flask is also degassed with an inert atmosphere. The Sb/Bi solution is then added to the reaction flask, still under an inert atmosphere and mixed thoroughly.

The NaTeH solution is filtered (always under an oxygen-free atmosphere) through a flitted glass filter. The reaction flask is stirred at 390 rpms, and the filtered hydride solution is added dropwise over 30 minutes. After 45 minutes, 100 ml of methanol is added. The reaction solution is decanted off and the product is collected with methanol and centrifugation. The product is kept under an inert atmosphere and washed with 17.5/82.5/0.4 water/methanol/NH40H (28%), by volume respectively. The product is then dried of solvent.

Samples of this purified powder may be initially baked at 395° C. for 5 mins under an argon flow. Punch and dies (for sintering the composite nanoparticles) are then loaded in the glove box. The thermoelectric composite nanoparticles may be sintered in a hot press at 395° C. and 50 MPa for 1 hour.

Figure 3:
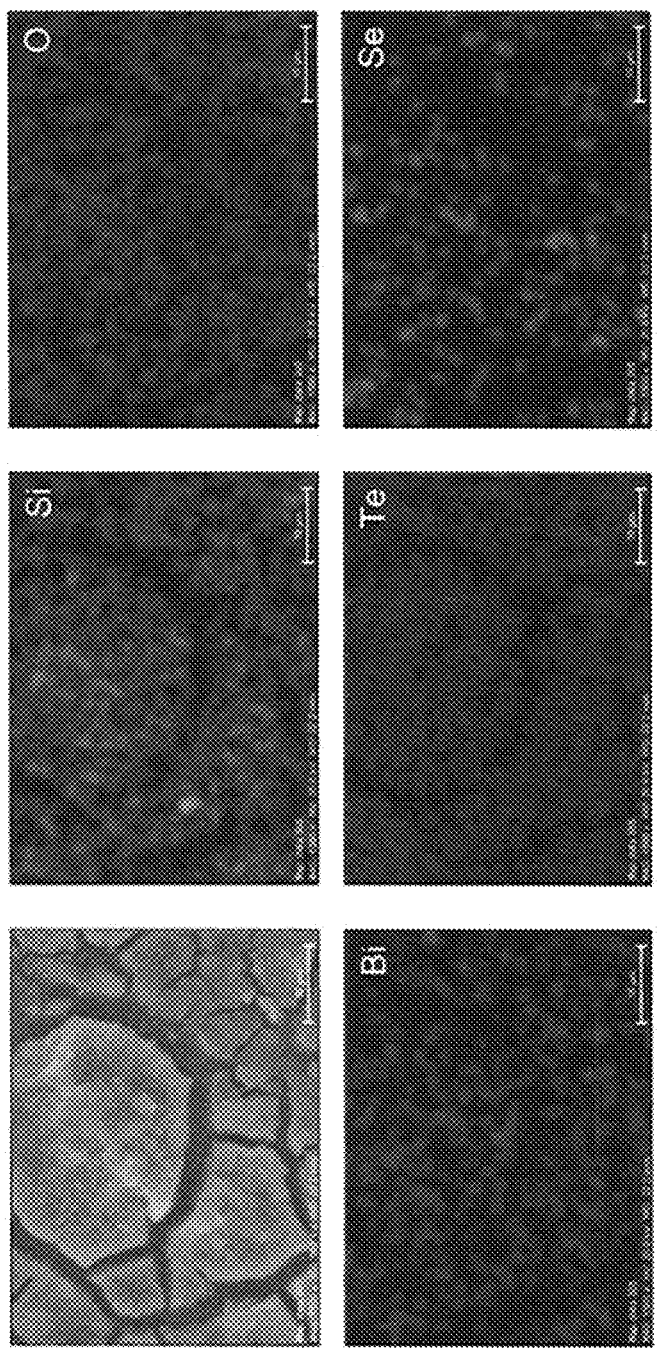
FIG. 3 is an SEM image of a material formed by the reaction of FIG. 1.
Figure 5:
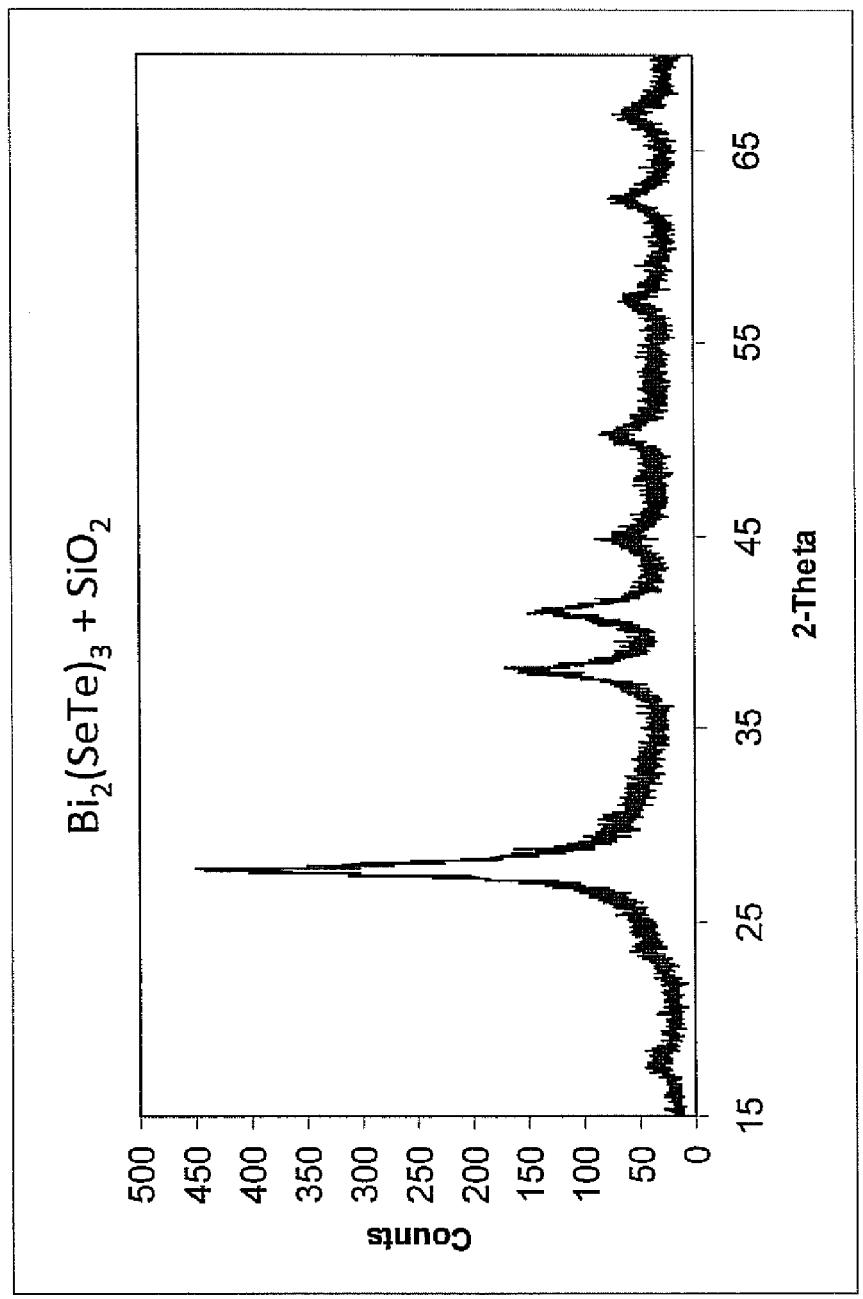
FIG. 5 is an XRD spectrum of a bismuth telluride material including Selenium.

The process described in the examples produces composite nanoparticles having a size of less than 10 nanometers and may include antimony or selenium-doped bismuth telluride with silica inclusions. As shown in FIG. 3 an N-type doped thermoelectric material may be produced by the procedure outlined in the specification and examples and selenium may be used as a doping material to produce N-type bismuth telluride material. The SEM-EDS images indicate a homogeneous distribution of Se, Bi, Te, O, and Si species. The XRD spectra of the material are shown in FIG. 5. The XRD data indicates formation of a pure N-type bismuth telluride material.

Figure 4:
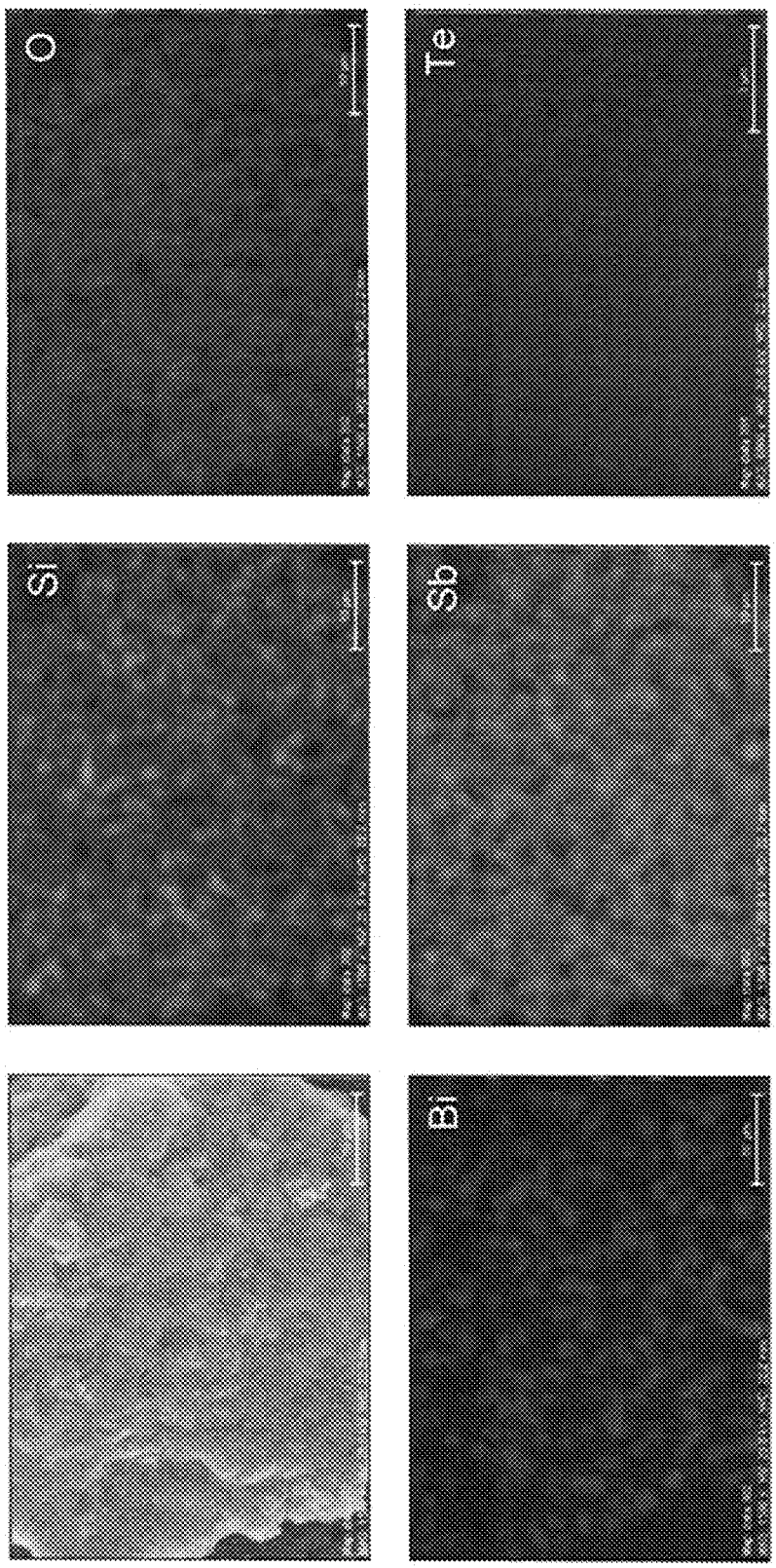
FIG. 4 is an SEM image of a material formed by the reaction of FIG. 2.

Additionally, as shown in FIG. 4 a P-type antimony doped material may be produced by the above described procedure. The SEM-EDS images indicate a homogeneous distribution of Sb, Bi, Te, O, and Si species.

The invention claimed is:

1. A process for forming thermoelectric nanoparticles including the steps of:
   providing a reducing agent, and at least one first metal;
   mixing the reducing agent and at least one first metal forming a premixed reducing solution;
   providing a second metal containing compound, and a core material;
   mixing the second metal containing compound, and the core material forming a premixed second metal reaction solution separate from the premixed reducing solution; and
   mixing and reacting the premixed second metal reaction solution with the premixed reducing solution, wherein a spontaneous alloying occurs about the core material forming thermoelectric composite nanoparticles.

2. The Process of claim 1 wherein the second metal is reduced by the premixed reducing solution and alloys about the core material.

3. The process of claim 1 wherein the second metal is selected from: bismuth, bismuth salts, bismuth citrate and ammonium bismuth citrate.

4. The process of claim 1 wherein the first metal is selected from tellurium, tellurium salts and sodium tellurium hydride.

5. The process of claim 1 including the step of mixing a P-type dopant with the second metal containing compound.

6. The process of claim 5 wherein the P-type dopant is selected from: antimony, antimony salt, and potassium antimony tartrate.

7. The process of claim 1 wherein the first metal is tellurium containing compound and the process further including the step of mixing an N-type dopant with the tellurium containing compound.

8. The process of claim 7 wherein the N-type dopant is selected from: selenium, sodium selenium hydride, and selenium salt.

9. The process of claim 1 wherein the thermoelectric composite nanoparticles have a core and shell structure.

10. The process of claim 9 wherein the core is selected from the group consisting of: $SiO_2$, metals, semiconductors, insulators, ceramics, carbon, polymers, ceramic materials having at least one of alumina, titanium dioxide, and zirconium oxide, and combinations thereof.

11. The process of claim 9 wherein the shell is selected from the group consisting of $Bi_2Te_3$, chalcogenide semiconductors, lead telluride chalcogenide semiconductors, metals, semi-metals, compounds having silicon and germanium, skutterudite materials, $CoSb_3$ skutterudite materials, rare earth intermetallics, $YbAl_3$, clathrate structured materials, silicon germanium clathrate structured materials, SN framework based clathrate materials, $Mg_2Si$, doped forms of $Mg_2Si$, half heusler alloys, MNiSn half heusler alloy materials where M represents Zr, Hf and Ti, multicomponent metal oxides, $NaCo_2O_4$, $Ca_3Co_4O_9$, and doping materials.

12. The process of claim 1 wherein the core material includes nanoparticles have a size of from 1 to 50 nanometers in diameter.

13. The process of claim 1 wherein the composite thermoelectric nanoparticles have a size of from 1 nanometer to 1 micron in diameter.

14. The process of claim 1 wherein the composite thermoelectric nanoparticles have a shell thickness of 0.5 to 100 nanometers.

15. The process of claim 1 including the step of decanting the composite thermoelectric nanoparticles.

16. The process of claim 1 including the step of washing the composite thermoelectric nanoparticles.

17. The process of claim 16 wherein the washing step includes the steps of washing the composite thermoelectric nanoparticles with water, methanol and ammonium hydroxide.

18. A process of forming a nanocomposite material comprising forming thermoelectric nanoparticles according to the steps of the process of claim 1 further including the step of nanoparticle fusion forming a the nanocomposite material following the formation of the composite thermoelectric nanoparticles wherein the nanocomposite material includes a network.

19. The process of claim 18 wherein the fusion step includes sintering the composite thermoelectric nanoparticles forming a network of a shell material including inclusions of the core material nanoparticles.

20. A process for forming thermoelectric nanoparticles including the steps of:
   providing a reducing agent, and a tellurium containing compound;
   mixing the reducing agent and tellurium containing compound forming a premixed reducing solution;
   providing a bismuth containing compound, and a core material;
   mixing the bismuth containing compound, and the core material forming a premixed bismuth reaction solution separate from the premixed reducing solution; and
   mixing and reacting the premixed bismuth reaction solution with the premixed reducing solution wherein bismuth ions of the bismuth containing compound are reduced to bismuth metal in the presence of tellurium wherein a spontaneous alloying occurs about the core material forming thermoelectric composite nanoparticles.

21. The process of claim 9 wherein the shell is a semi-metal selected from the group consisting of binary, ternary and quaternary alloys of conductors, binary, ternary and quaternary alloys of semiconductors, and binary, ternary and quaternary alloys of insulators.

22. The process of claim 9 wherein the shell comprises doping materials having a member selected from the group consisting of groups III, IV, V, VI, and VII elements, oxides of groups III, IV, V, VI, and VII elements, alloys of groups III, IV, V, VI, and VII elements, and salts groups III, IV, V, VI, and VII elements.

* * * * *

UNITED STATES PATENT AND TRADEMARK OFFICE
CERTIFICATE OF CORRECTION

| | | |
|---|---|---|
| PATENT NO. | : 8,568,607 B2 | |
| APPLICATION NO. | : 13/023015 | |
| DATED | : October 29, 2013 | |
| INVENTOR(S) | : Michael Paul Rowe | |

It is certified that error appears in the above-identified patent and that said Letters Patent is hereby corrected as shown below:

In the Claims

In column 5, claim number 7, line number 44, the word --a-- needs to be inserted between the word "is" and "tellurium".

Signed and Sealed this
Sixteenth Day of December, 2014

Michelle K. Lee
*Deputy Director of the United States Patent and Trademark Office*